United States Patent
Kaminaga et al.

(10) Patent No.: US 10,783,095 B2
(45) Date of Patent: Sep. 22, 2020

(54) SEMICONDUCTOR MEMORY DEVICE AND CONTINUOUS READING METHOD FOR THE SAME

(71) Applicant: WINBOND ELECTRONICS CORP., Taichung (TW)

(72) Inventors: Takehiro Kaminaga, Taichung (TW); Katsutoshi Suito, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 32 days.

(21) Appl. No.: 15/719,199

(22) Filed: Sep. 28, 2017

(65) Prior Publication Data

US 2018/0088867 A1 Mar. 29, 2018

(30) Foreign Application Priority Data

Sep. 28, 2016 (JP) ................. 2016-189875

(51) Int. Cl.
*G06F 13/16* (2006.01)
*G06F 12/02* (2006.01)
(Continued)

(52) U.S. Cl.
CPC .......... *G06F 13/16* (2013.01); *G06F 12/0246* (2013.01); *G06F 13/28* (2013.01);
(Continued)

(58) Field of Classification Search
CPC ...... G11C 7/1018–1033; G11C 7/1075; G11C 29/22; G11C 29/86; G11C 2216/30
See application file for complete search history.

(56) References Cited

U.S. PATENT DOCUMENTS

| 8,250,287 B1* | 8/2012 | Mirichigni | G06F 13/00 365/185.05 |
| 2001/0033245 A1* | 10/2001 | Campanale | G11C 7/1018 341/200 |

(Continued)

FOREIGN PATENT DOCUMENTS

| JP | 2015-008021 A | 1/2015 |
| KR | 100626391 B1 | 9/2006 |
| KR | 10-1556392 B1 | 9/2015 |

OTHER PUBLICATIONS

Dan et al. "Implementing MLC NAND Flash for Cost-Effective, High-Capacity Memory." Sep. 2003. M-Systems. Rev 1.1. http://dataioinfo.dataio.com/pdf/NAND/MSystems/Implementing_MLC_NAND_Flash.pdf. (Year: 2003).*

(Continued)

*Primary Examiner* — Nathan Sadler
(74) *Attorney, Agent, or Firm* — Muncy, Geissler, Olds & Lowe, P.C.

(57) ABSTRACT

A semiconductor memory device is provided. The semiconductor memory device includes a memory cell array, a page-reading portion which selects a page of the memory cell array, reads data of the selected page, and transmits the read data to a data-holding portion, and a control portion which controls continuous reading of pages. When a command related to termination of the continuous reading is input, the control portion terminates the continuous reading. When the command related to the termination of the continuous reading is not input, the continuous reading terminates. During a period in which the continuous reading is performed continuously, even if a chip selection signal is toggled, the continuous reading can be performed continuously without inputting a page-data read command.

9 Claims, 9 Drawing Sheets

(51) Int. Cl.
  *G11C 16/32* (2006.01)
  *G11C 16/26* (2006.01)
  *G06F 13/28* (2006.01)

(52) U.S. Cl.
  CPC .............. *G11C 16/26* (2013.01); *G11C 16/32* (2013.01); *G06F 2212/1024* (2013.01); *G06F 2212/7203* (2013.01)

(56) References Cited

U.S. PATENT DOCUMENTS

| | | | |
|---|---|---|---|
| 2002/0015328 A1* | 2/2002 | Dono | G11C 14/00 365/185.08 |
| 2002/0016898 A1* | 2/2002 | Hashimoto | G06F 13/1631 711/202 |
| 2002/0024884 A1* | 2/2002 | Roohparvar | G11C 7/1021 365/238.5 |
| 2006/0224789 A1 | 10/2006 | Cho et al. | |
| 2008/0114901 A1* | 5/2008 | Chou | G06F 13/4286 710/5 |
| 2008/0126776 A1 | 5/2008 | Takayama | |
| 2008/0137467 A1* | 6/2008 | Pyeon | G06F 13/1673 365/230.06 |
| 2008/0201553 A1* | 8/2008 | Kawamoto | G06F 12/0246 711/206 |
| 2009/0193183 A1* | 7/2009 | Kudo | G11C 7/1027 711/103 |
| 2013/0145093 A1* | 6/2013 | Kaminaga | G11C 7/1051 711/114 |
| 2014/0104947 A1 | 4/2014 | Yamauchi et al. | |
| 2018/0090202 A1* | 3/2018 | Kaminaga | G11C 16/0483 |

OTHER PUBLICATIONS

Samsung. "SDRAM Device Operations." 2005. http://www-micro.deis.unibo.it/~romani/Dida01/lezioni/sdram_operation_timing.pdf.*

Kim et al., 1Gb F-die NAND Flash, Jul. 2016, 36 pages, Samsung.

TIPO. Office Action dated Nov. 15, 2018. 9 pages.

* cited by examiner

| | erase | write | read |
|---|---|---|---|
| selected W/L | 0 | 15~20V | 0 |
| unselected W/L | F | 10V | 4.5 |
| SGD | F | Vcc | 4.5 |
| SGS | F | 0 | 4.5 |
| SL | F | Vcc | 0 |
| P# | 20 | 0 | 0 |

SEMICONDUCTOR MEMORY DEVICE AND CONTINUOUS READING METHOD FOR THE SAME

CROSS REFERENCE TO RELATED APPLICATIONS

This Application claims priority of Japan Patent Application No. JP2016-189875, filed on Sep. 28, 2016, the entirety of which is incorporated by reference herein.

BACKGROUND OF THE INVENTION

Field of the Invention

The invention relates to a semiconductor memory device, such as a flash memory, and more particularly to a continuous reading method for one page or a plurality of pages of a semiconductor memory device.

Description of the Related Art

Compared with a NOR flash memory, a NAND flash memory can have a memory cell array with a high degree of integration, and, thus it is suitable to store data requiring a large memory capacity, such as image data and music data. On the other hand, since it is necessary to read data from the memory cell array and transmit it to the page buffer, the time required for reading is longer than that of a NOR flash memory.

In recent years, flash memories have increasingly been equipped with serial interfaces for speeding up data input/output with a small number of terminals. The serial interface comprises, for example, a standard serial peripheral interface (SPI) which requires an 8-bit instruction code and a 24-bit address. Patent Document 1 discloses a serial flash memory that extends the address capability without changing the SPI protocol.

Patent Document 1: Japanese Patent Publication No. 2015-8021.

Figure 1A:
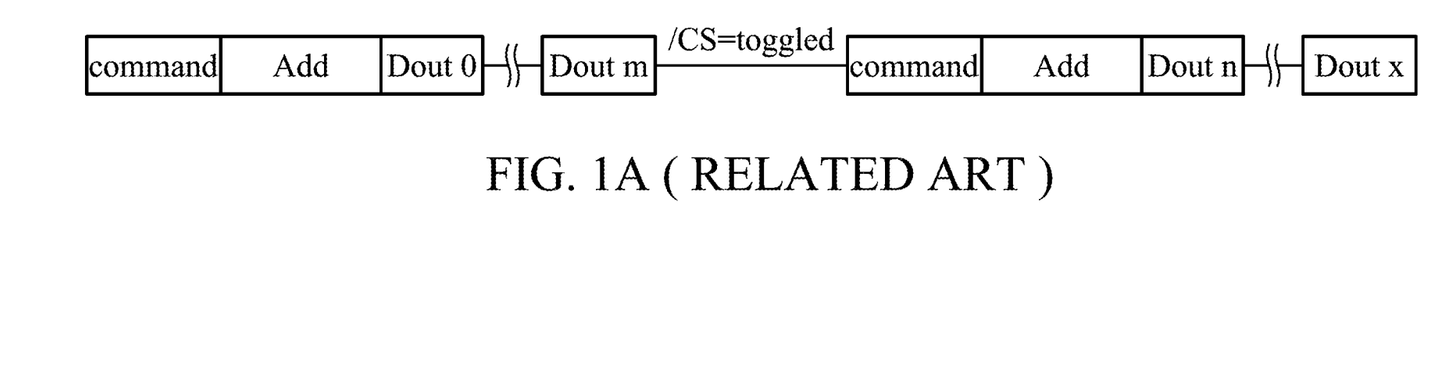
FIG. 1A is a schematic view showing a continuous reading operation of a NOR flash memory.

A NOR flash memory can continuously read data in a so-called burst mode. FIG. 1A shows a timing chart of a continuous reading operation of the flash memory. When the chip selection signal CS reaches a low level, the flash memory becomes active. For example, a read command and an address may be synchronized with the rising edge of the serial clock and then input from the input terminals. The flash memory automatically increments the address and sequentially synchronizes the read data with the falling edge of the serial clock and then outputs the read data through the output terminal. When the chip selection signal CS reaches a high level, the flash memory is unselected (i.e. it is put in a standby state), and the continuous reading of the data stops.

On the other hand, in order to achieve compatibility with a NOR serial flash memory, a serial interface equipped in a NAND flash memory is used practically. Unlike the NOR flash memory, the NAND flash memory must read data from the pages of the memory cell array and write it to a page buffer/sensing circuit temporarily, and, thus, a special command or instruction for that purpose is required. Hereinafter, this specific command is referred to as "page-data read command". Therefore, in cases where continuous reading is performed in the NAND flash memory, a page-data read command and a page address at which reading is started are input, and after a latency corresponding to a period in which the data is read from the page of the memory cell array, it is necessary to input a read command which is used for outputting the data held in the page buffer/sensing circuit.

In order to continuously perform data serial inputting/serial outputting, the NAND flash memory has a data register (or a cache register) for holding the data transferred from the page buffer/sensing circuit. A two-stage pipeline is composed of the page buffer/sensing circuit and the data register. In continuous reading, the page count is automatically increased, and the page data is sequentially transferred to the page buffer/sensing circuit. The data held in the data register during this period is synchronized with the serial clock and then serially output to the outside.

Figure 1B:
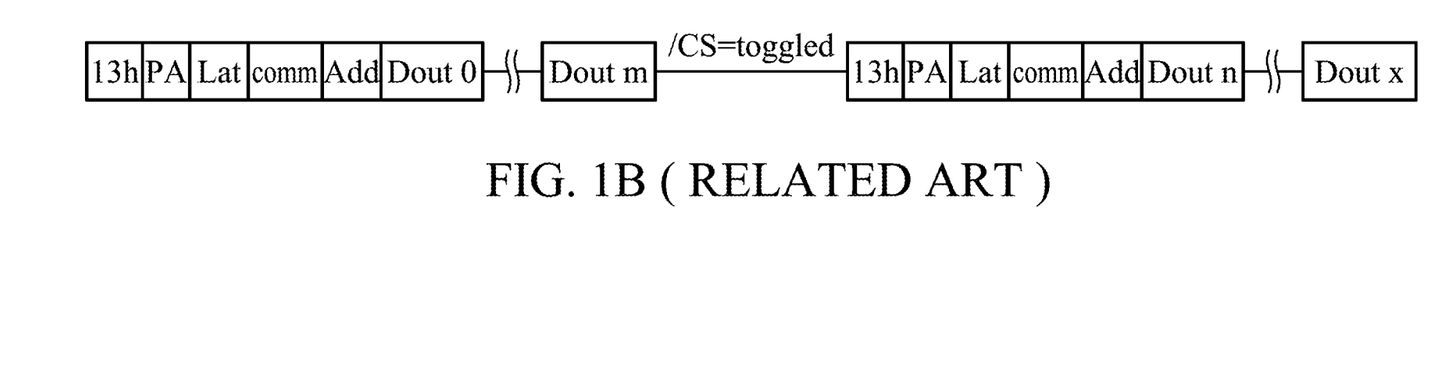
FIG. 1B is a schematic view showing a continuous reading operation of a NAND flash memory.

FIG. 1B shows a timing chart of a continuous reading operation of the NAND flash memory. When the chip selection signal CS reaches a low level, an 8-bit page-data read command (for example, "13h") and a 16-bit page address PA (a row address for selecting a block and a page) are input from the host device. After the latency corresponding to a period in which the data of the selected page of the memory cell array is transferred to the page buffer/sensing circuit, an 8-bit read command for continuous reading and a 16-bit address (this is an empty virtual address for the continuous reading) are input. The NAND flash memory is in a continuous reading mode according to the inputting of a series of instructions and addresses. The input page address PA is automatically increased, and the page data which is read sequentially is synchronized with the serial clock and then serially output to the outside. During the period in which the chip selection signal CS is at the low level, that is, during the continuous reading mode, it is unnecessary to input the page-data read command and the page address PA for the flash memory.

When the chip selection signal CS is toggled to a high (H) level, the continuous reading operation terminates. In cases where continuous reading is required again, the chip selection signal CS is set to the low (L) level, the page-data read command "13h" and the page address PA are input again, and after a certain latency, the read command and the address for reading data are input. In this way, when the chip selection signal CS is toggled, the continuous reading mode terminates.

Moreover, in a general use situation of a flash memory having a serial interface, the data size that can be read at a time is restricted by the size of the cache register of the CPU on the host device side. That is, when the cache register of the CPU is filled with data from the flash memory, the host device sets the chip selection signal CS to the H level, so that the continuous reading of the flash memory stops. During this period, the CPU processes the data held in the cache register. When the data process of the CPU is completed, the host device sets the chip selection signal CS to the L level, so that, the flash memory is accessed again to start the continuous reading.

Figure 2:
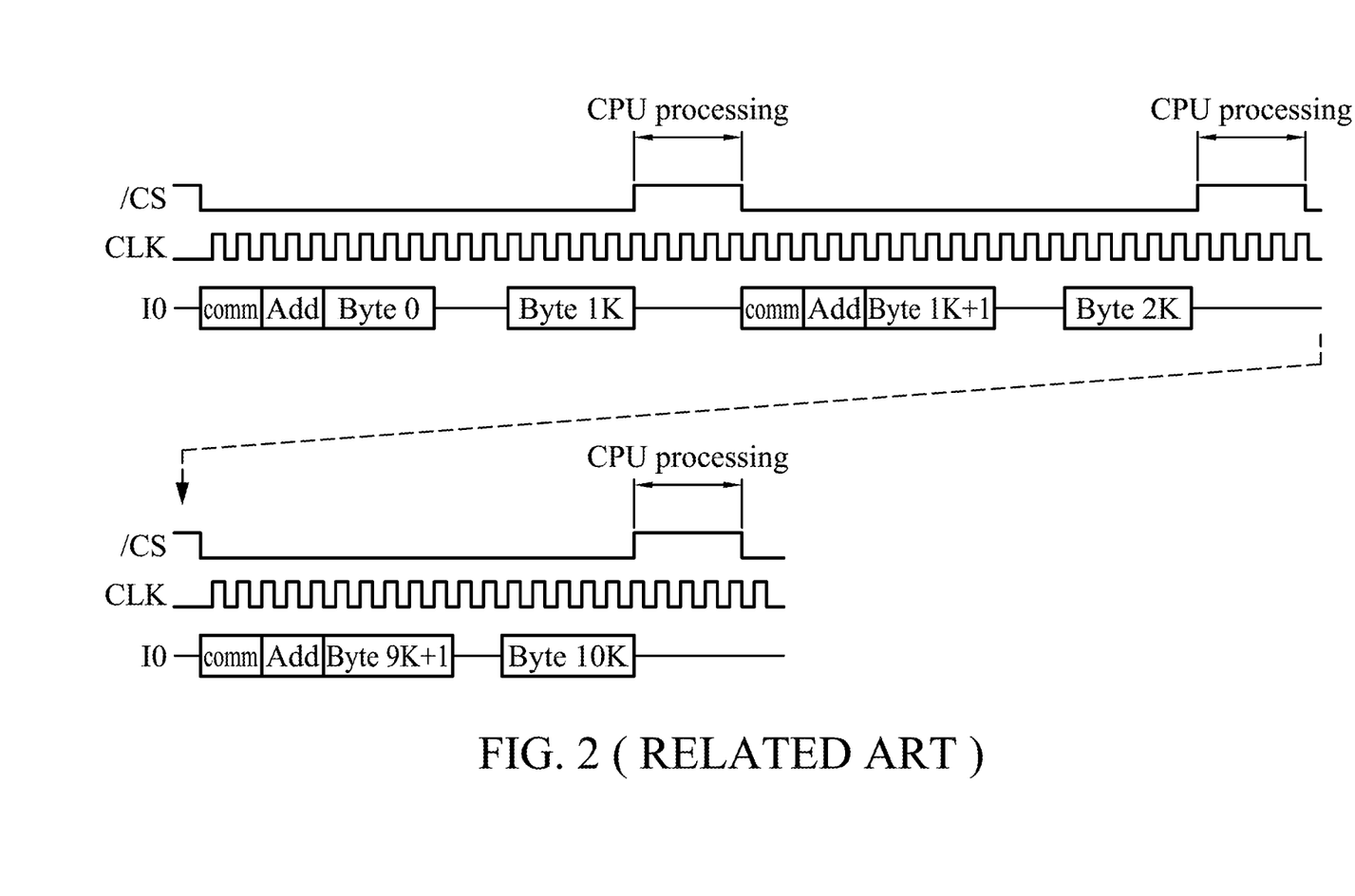
FIG. 2 is a schematic view showing a normal operation of a NOR flash memory with a serial interface.

FIG. 2 is a schematic view showing that data of 10K bytes is read from the NOR flash memory when the cache register of the CPU is 1K byte. When a command and an address for continuous reading are input to the flash memory, data is output from the flash memory to the host device. When the data size reaches 1K byte, the host device sets the chip selection signal CS to the H level. During this period, the data of 1K byte held in the cache register is processed. Next, the host device sets the chip selection signal CS to the L level, outputs a command and an address for the continuous reading again, and receives data of 1K byte of from the flash memory.

In cases where the NAND flash memory performs the continuous reading, it is preferable that high compatibility with the NOR flash memory is obtained, and when the chip selection signal CS is toggled, the same command and address as the NOR flash memory are input. Furthermore, in order to increase the speed of the continuous reading, it is desired to avoid inputting a page-data reading command and a page address every time the chip selection signal CS is toggled.

BRIEF SUMMARY OF THE INVENTION

It is an object of the present invention to provide a semiconductor memory device capable of solving such conventional problems and increasing speed of continuous reading.

An exemplary embodiment of a semiconductor memory device is provided. The semiconductor memory device comprises a memory cell array, a page-reading portion, and a control portion. The page-reading portion selects a page of the memory cell array, read data of the selected page, and transmits the read data to a data-holding portion. The control portion controls continuous reading of pages. The continuous reading is performed by the page-reading portion. When a command related to termination of the continuous reading is input, the control portion terminates the continuous reading.

The command related to the termination of the continuous reading is preferably a command for programming, a command for erasing, or a predetermined command. In a preferable embodiment, the control portion is in a continuous reading mode continuously until the command related to the termination of the continuous reading is input. During the continuous reading mode, the continuous reading is performed continuously without inputting a page-read command used for the page-reading portion to perform the continuous reading. In another preferable embodiment, during a discontinuous reading mode, the control portion terminates the continuous reading in response to an external control being disabled. During the continuous reading mode, after the external control signal is disabled and then toggled, the continuous reading is performed without inputting a page-data read command. During the continuous reading mode, the control portion preferably stores a page address and a column address which are presented when the external control signal is disabled, the read data is held by the page-reading portion. When the external control signal is toggled, the control portion outputs the data which is held by the page-reading portion according to the stored page address and column address. In a preferable embodiment, a page which is initially selected by the page-reading portion during the continuous reading is designated by a page address which is input to the semiconductor memory device. In another preferable embodiment, a page which is initially selected by the page-reading portion during the continuous reading is designated by a predetermined page address, and the predetermined page address is a page address which is first read from the memory cell array when a power supply is turned on.

An exemplary embodiment of a flash memory is provided. The flash memory comprises a NAND memory cell array, a page buffer, a data register, and a continuous reading portion. The page buffer holds data transmitted from a selected page of the NAND memory cell array or holds programming data. The data register performs a bidirectional data transmission with the page buffer. The continuous reading portion continuously reads data of a page of the NAND memory cell array and outputs the data in synchronization with an external serial clock through the data register. The continuous reading portion continuously reads the data without a page-data read command until a command for termination of continuous reading is input.

An exemplary embodiment of a continuous reading method for NAND flash memory is provided. The continuous reading method comprises the steps of monitoring whether a command for termination of continuous reading is input; when the command for the termination of the continuous reading is input, terminating the continuous reading; when the command for the termination of the continuous reading is not input, performing the continuous reading continuously; and when the continuous reading is performed continuously, reading data continuously without input of a page-data read command.

According to the embodiments of the present invention, since the continuous reading terminates in response to the command related to the termination of the continuous reading, the continuous reading mode can be continued until the command related to the termination of the continuous reading is input. During this period, even if the continuous reading is temporarily interrupted, it is possible to resume the continuous reading without a page-data read command thereafter.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Hereinafter, embodiments of the present invention will be described in detail with reference to the drawings. A semiconductor memory device of the present invention can be a NAND flash memory or a semiconductor memory device in which such a flash memory is embedded. In a preferred embodiment, the NAND flash memory comprises a serial interface. However, the NAND flash memory may not comprise a serial interface and a parallel interface simultaneously. The serial interface comprises, for example, a terminal for inputting a serial clock SCK, a terminal for inputting serial data, a terminal for outputting serial data, a terminal for performing chip selection, a terminal for performing writing protection, and terminals for power supplies Vdd and GND. The bit width of the terminal for inputting serial data and the bit width of the terminal for outputting serial data are not limited to ×1 but may be ×4, ×8. In the serial interface, when a chip selection signal CS is asserted to a low level, data input/output and command and address input are performed in synchronization with an external serial clock SCK.

Figure 3:
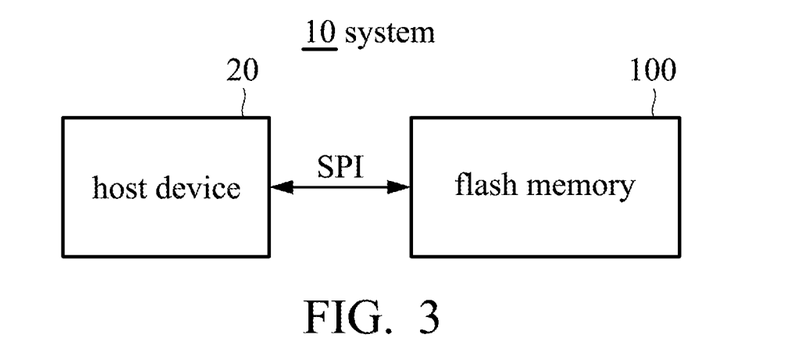
FIG. 3 shows an exemplary embodiment of a system according to the present invention.

Next, embodiments of the present invention will be described. FIG. 3 shows an example of a system according to an embodiment of the present invention. A system 10 of the present embodiment comprises a host device 20 and a NAND flash memory 100. The flash memory 100 is connected to the host device 20 via a serial interface, such as SPI. The host device 20 can be, for example, a processor, a controller, or a computer. The system 10 may be all or part of a packaged semiconductor device, a computer device, a computer system, a storage device, or a storage system.

Figure 4:
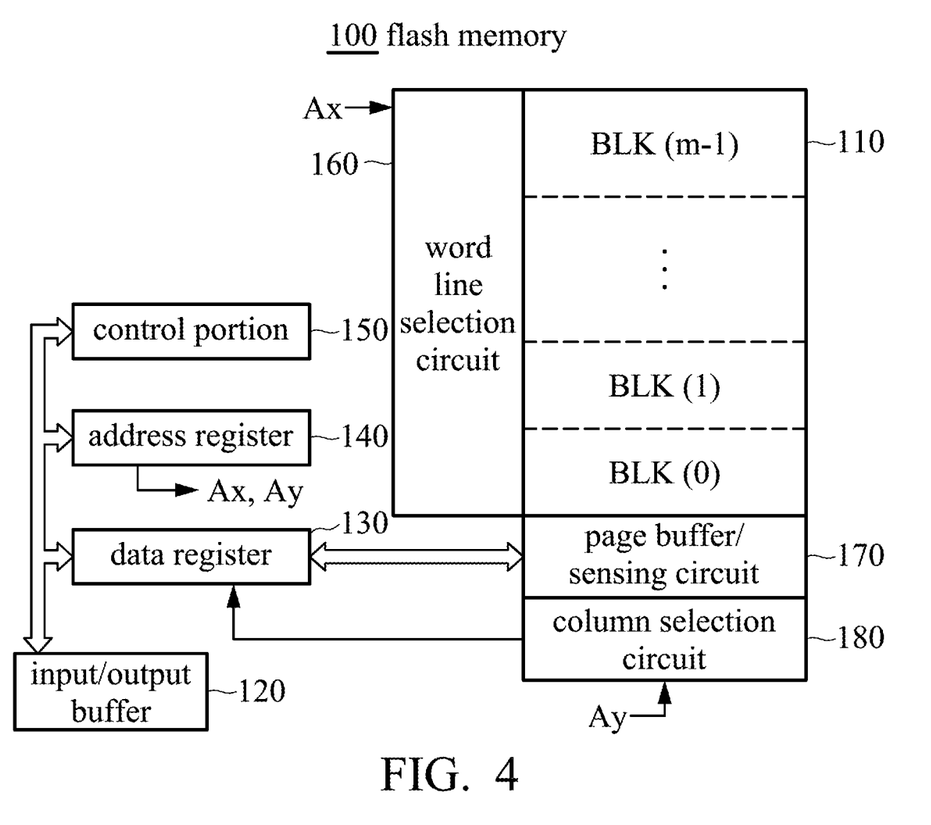
FIG. 4 shows an exemplary embodiment of a configuration of a NAND flash memory according to the present invention.

FIG. 4 shows the configuration of the NAND flash memory 100 according to the embodiment. The flash memory 100 comprises a memory cell array 110, an input/output buffer 120, a data register 130, an address register 140, a control portion 150, a word line selection circuit 160, a page buffer/sensing circuit 170, and a column selection circuit 180. The memory cell array 110 is formed by a plurality of memory cells arranged in rows and columns. The input/output buffer 120 is connected to an external terminal. The data register 130 receives data from the input/output buffer 120 or output data to the input/output buffer 120. The address register 140 receives address data from the input/output buffer 120. The control portion 150 controls data reading, programming, or erasing according to a command (instruction) from the input/output buffer 120 and an external control signal (a chip selection signal CS, a writing protection signal WP, etc.). The word line selection circuit 160 decodes the row address information Ax from the address register 140 and performs a selection operation for blocks or pages of the memory cell array 110 according to the decoding result. The page buffer/sensing circuit 170 holds the data which is read through the bit lines and the data which is programmed through the bit lines. The column selection circuit 180 decodes the column address information Ay from the address register 140 and performs a selection operation for the bit lines according to the decoding result. The flash memory 100 may comprise an internal voltage generating circuit (not shown) which is used to generate the voltages (the programming voltage Vpgm, the pass voltage Vpass, the reading voltage Vread, the erasing voltage Vers (including erase pulses)), which are necessary for data reading, programming (writing), and erasing.

Figure 5:
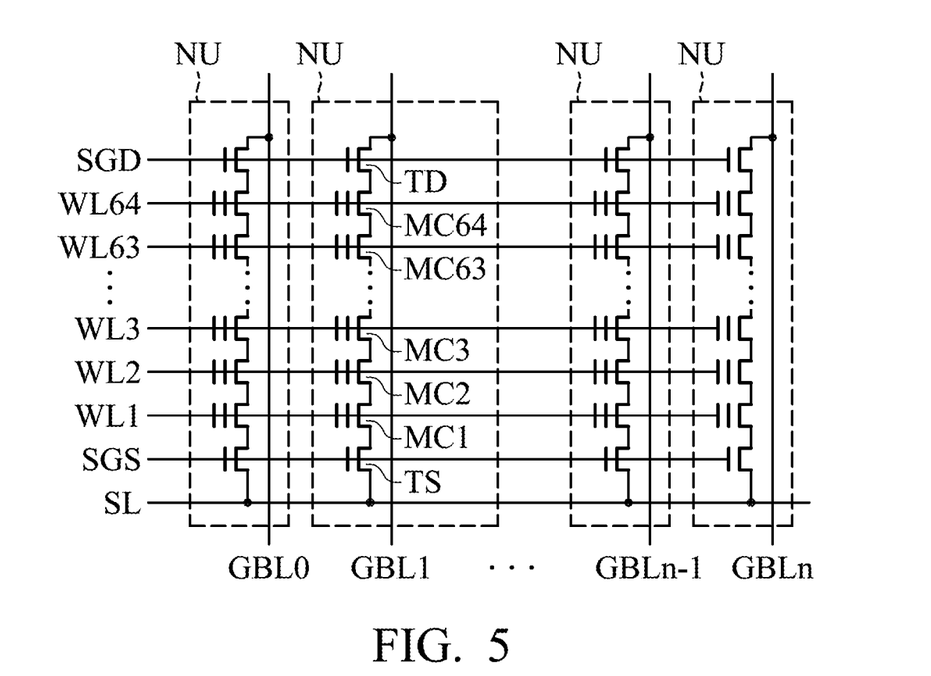
FIG. 5 shows is a schematic view showing a NAND string.

The memory cell array 110 comprises a plurality of blocks (BLK) (for example, block 0~block 1023). As shown in FIG. 5, n+1 NAND strings NU (For example, 2 KB), each formed by a plurality of memory cells connected in series, are arranged in the row direction. A single NAND string NU comprises a plurality of memory cells MCi (i=1, 2, 3, . . . , 64) connected in series, a bit-line-side selection transistor TD connected to the drain of the memory cell MC64 on one terminal side, and a source-line-side selection transistor TS connected to the source of the memory cell MC1. The drain of the bit-line-side selection transistor TD is connected to one corresponding bit line GBL, and the source-line-side selection transistor TS is connected to a common source line SL.

Figure 6:
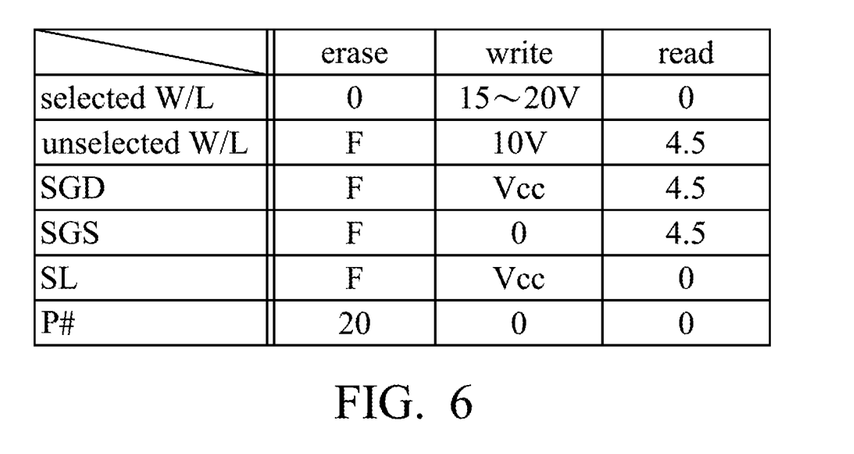
FIG. 6 is a table showing an exemplary embodiment of a applied bias voltage when a NAND flash memory operates.

FIG. 6 is a table showing an example of a bias voltage applied in each operation of the flash memory. In the reading operation, a certain positive voltage is applied to the bit lines, a certain voltage (for example, 0 V) is applied to the selected word line, the pass voltage Vpass (for example, 4.5 V) is applied to the unselected word line, a positive voltage (for example, 4.5 V) is applied to the selection gate lines SGD and SGS, the bit-line-side selection transistor TD and the source-line-side selection transistor TS are turned on, and the common source line SL is set to 0V. In the programming operation, the programming voltage Vprog with a high voltage level (15 to 20 V) is applied to the selected word line, an intermediate potential (for example, 10 V) is applied to the unselected word line, the bit-line-side selection transistor TD is turned on, the source-line-side selection transistor TS is turned off, and a potential corresponding to the data "0" or "1" is applied to the bit line GBL. In the erasing operation, 0 V is applied to the selected word line in the block, a high voltage (for example, 20 V) is applied to the P well, and electrons of the floating gate are pulled out to the substrate, thereby erasing the data by using one block as a unit.

The page buffer/sensing circuit 170 comprises a latch circuit that holds data read from the memory cell array 110 and holds data to be programmed in the memory cell array 110. The latch circuit can hold data of one page (for example, 2 KB).

The latch circuit of the page buffer/sensing circuit 170 is connected to the data register 130 via a transmission circuit which can perform bidirectional data transmission. Like the latch circuit, the data register 130 can hold data of one page. Each of the latch circuit and the data register 130 comprises a first cache portion and a second cache portion, and data of the first cache portion and the data of the second cache portion can be transmitted independently. For example, the data held by the first cache portion of the latch circuit is transmitted to the first cache portion of the data register 130, and the data held by the second cache portion of the latch circuit is transmitted to the second cache portion of the data register 130.

Figure 7A:
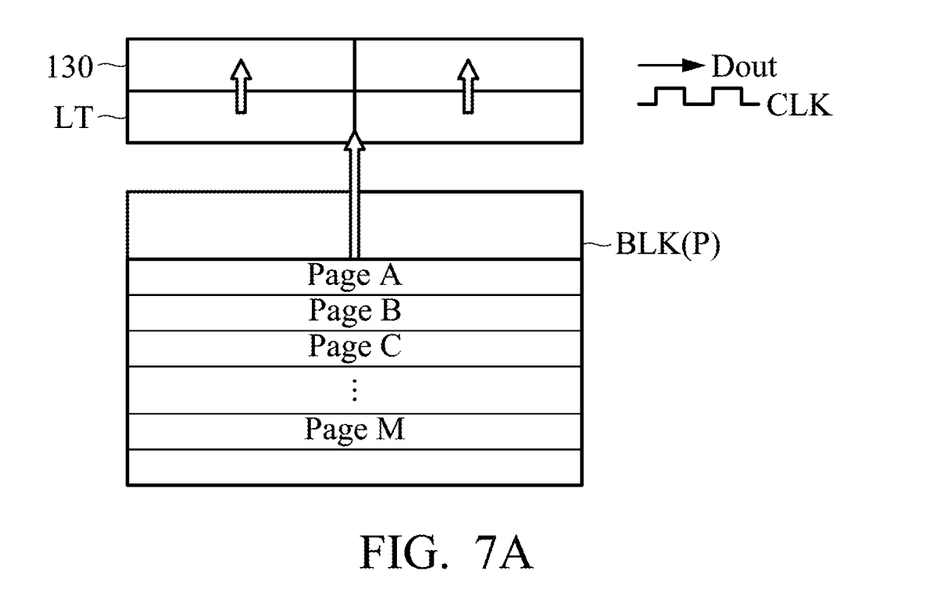
FIGS. 7A and 7B are schematic views showing operations of a latch circuit of a page buffer/sensing circuit and a data buffer when a flash memory performs continuous reading according to an exemplary embodiment.

Through two stages of pipelines formed by the latch circuit of the page buffer/sensing circuit 170 and the data register 130, it is possible to speed up the continuous reading of pages. For example, as shown in FIG. 7A, in cases where the data in the page A, page B, . . . page M of the block (P) is read continuously, the data of the page A is first transmitted to the latch circuit LT of the page buffer 170, and then, the data of the page A is transmitted to the data register 130. Next, during the period in which the data (A) held in the data register 130 is output serially, the data of the next page, page B, is transmitted to the latch circuit LT.

Figure 7B:
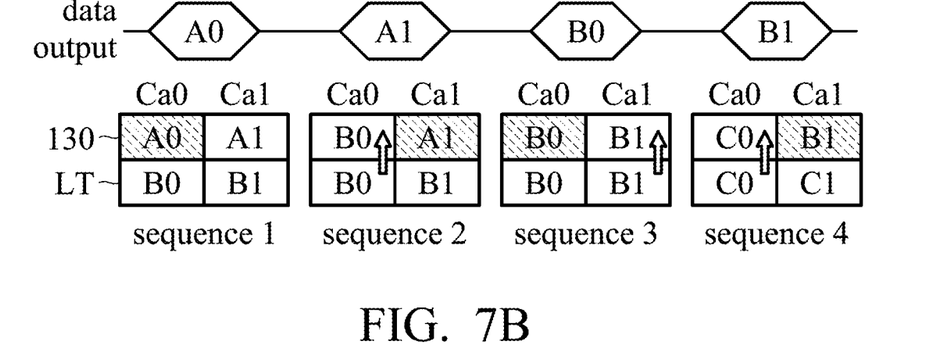

FIG. 7B shows details of the operations related to the first cache portions Ca0 and the second cache portions Ca1 of the latch circuit LT and the data register 130. Each of the first cache portions Ca0 and the second cache portions Ca1 holds data of ½ Page, and A0, A1, B0, B1, C0, C1 are ½ of the pages A, B, and C, respectively.

In the sequence 1, the page data A0 is output from the first cache portion Ca0 of the data register 130; in sequence 2, the page data A1 is output from the second cache portion Ca1 of the data register 130. At this time, the page data B0 of the first cache portion Ca0 of the latch circuit LT is transmitted to the first cache portion Ca0 of the data register 130. In the sequence 3, while the page data B0 of the first cache portion Ca0 of the data register 130 is output, the page data B1 of the second cache portion Ca1 of the latch circuit LT is transmitted to the second cache portion Ca1 of the data register 130. In the sequence 4, while the page data B1 of the second cache portion Ca1 of the data register 130 is output, the page data C0 of the first cache portion Ca0 of the latch circuit LT is transmitted to the first cache portion Ca0 of the data register 130. The data read from the data register 130 is synchronized with the internal clock CLK and then transmitted to the input/output buffer 120, and the transmitted data is synchronized with the external clock SCK and then serially output by the external output terminal.

The flash memory 100 of the embodiment can operate in response to a command related to the termination of the continuous reading. The flash memory 100 continuously operates in the continuous reading mode until the command related to the termination of the continuous reading is output. When the command related to the termination of the continuous reading is output, the continuous reading terminates. During a period in which the continuous reading mode is continued, even if the chip selection signal CS is toggled, the continuous reading can be performed without inputting the page-data read command and the page address PA. In respond to the input of the command related to the termination of the continuous reading, the continuous reading terminates. On the other hand, the host device 20 of the embodiment can issue the command related to the termination of the continuous reading to the flash memory 100 when the continuous reading is to terminate.

Figure 8:
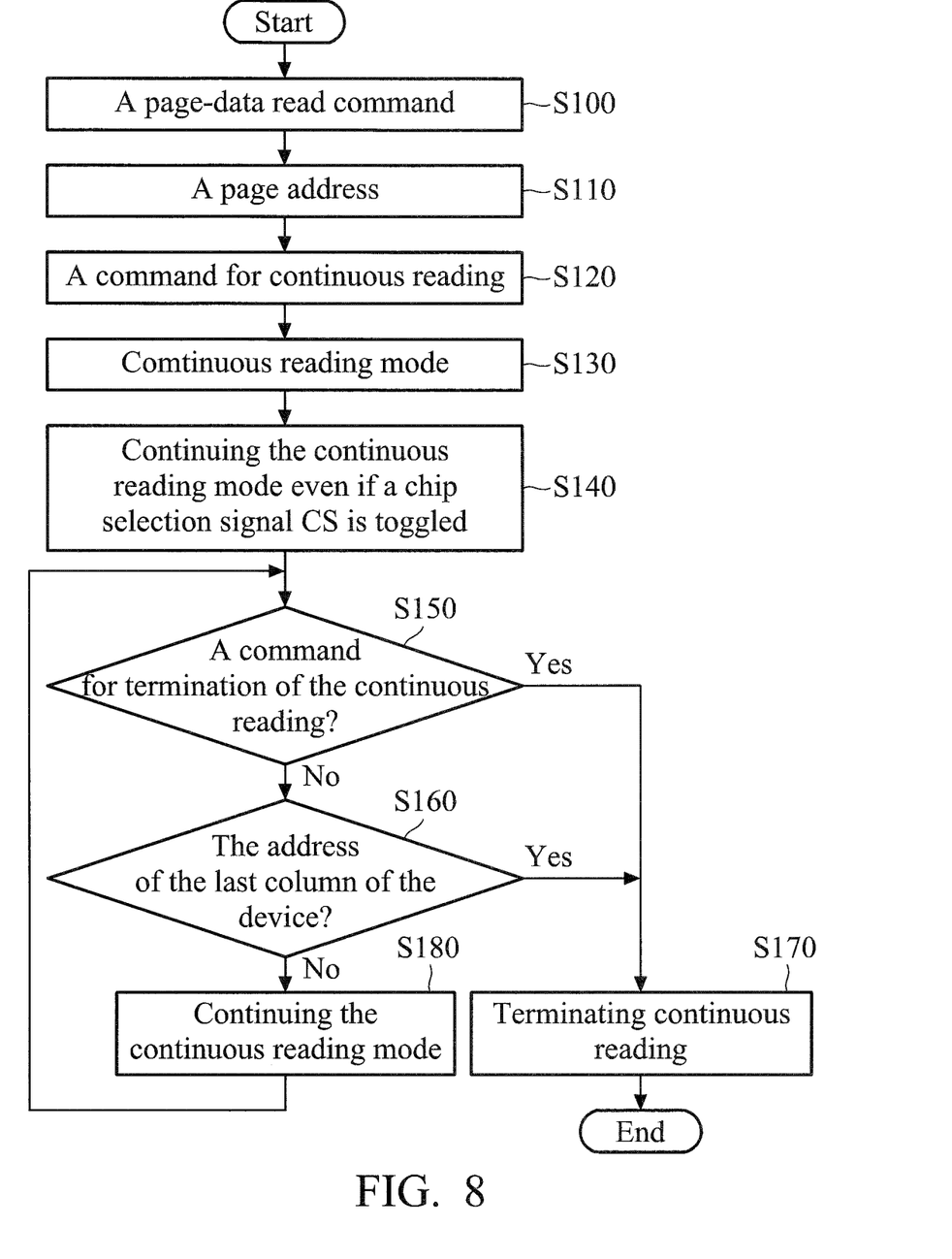
FIG. 8 shows a flow chart of a continuous reading operation of a flash memory according to a first embodiment.
Figure 9:
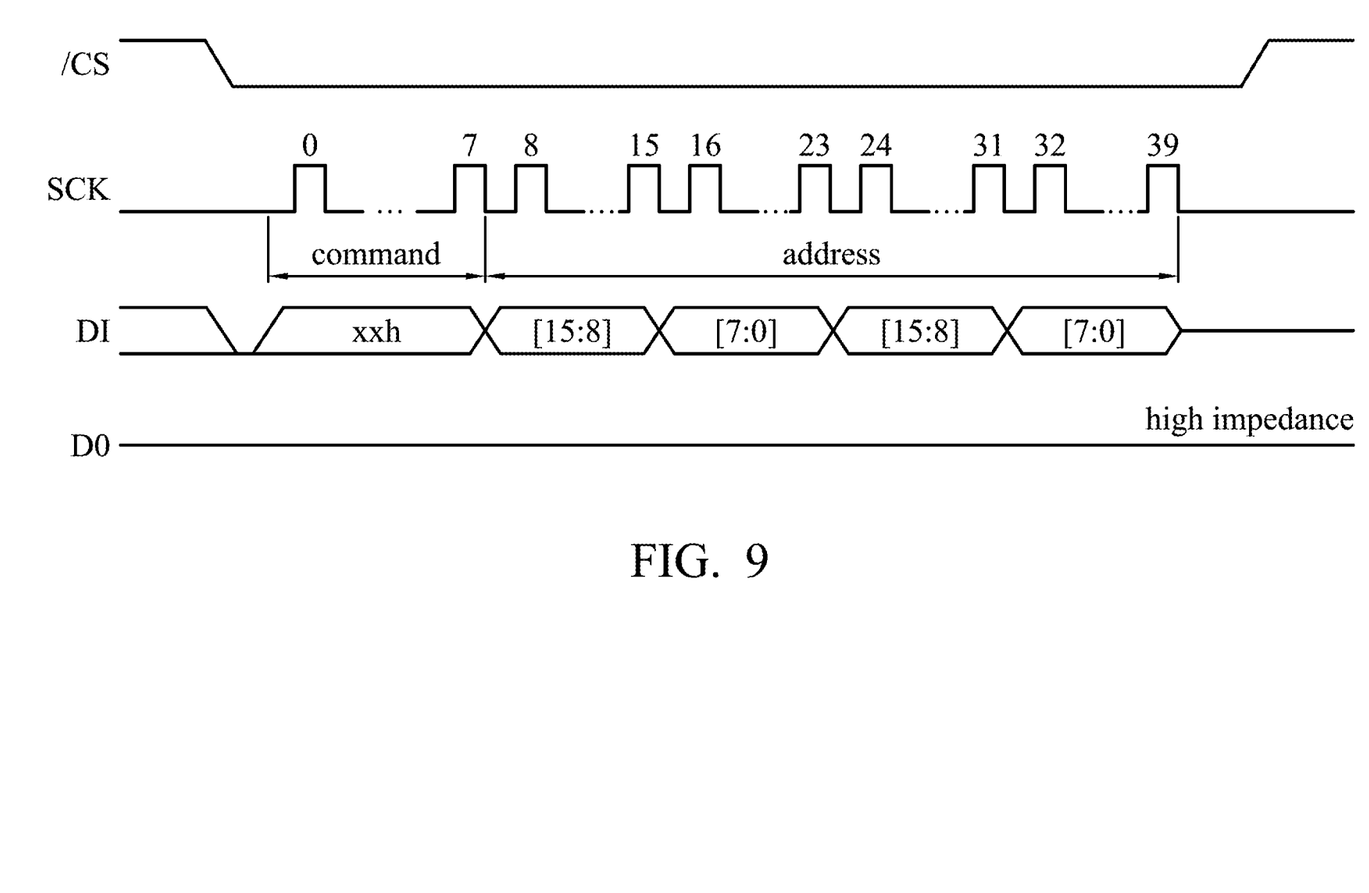
FIG. 9 shows a timing chart in which data is serially input to a flash memory.

Next, the continuous reading operation of the flash memory according to the first embodiment of the present invention will be described. FIG. 8 shows a flow chart of a continuous reading operation according to the embodiment. When the chip selection signal CS is asserted to a low level, and a page-data read command (for example, "13h") and a page address PA are input to the flash memory 100 from the host device 20 in synchronization with the external serial clock SCK (S100, S110). FIG. 9 shows a timing chart in which data is serially input to the flash memory. The chip selection signal CS is set to the low level by the host device 20 to select (activate) the flash memory 100, and then the 8-bit page-data read command (for example, "13h") and the 16-bit page address are synchronized with the external serial clock SCK and are taken into the flash memory.

In response to the page-data read command, the control portion 150 selects the page designated by the page address PA from the memory cell array 110t, so that the data of the selected page is read by the page buffer/sensing circuit 170. The page address PA which is initially input designates the first page presented when continuous reading is performed.

After the latency corresponding to the reading period in response to the page-data read command, the host device 20 issues a command and an address for continuous reading to the flash memory 100 (S120). The command and the address are also taken into the flash memory 100 according to the serial input sequence shown in FIG. 9. Moreover, the continuous reading of the NAND flash memory is performed initially to the column address designated by the page address PA (for example, the starting column address). Therefore, in cases where the continuous reading is performed, the column address is actually unnecessary, and a dummy (empty) address is input.

When a series of commands and addresses are input, the control unit 150 is switched to the continuous reading mode (S130), reads data consecutively from the page designated by the page address PA, and outputs the read data to the host device 20 in synchronization with the clock SCK.

Figure 10A:
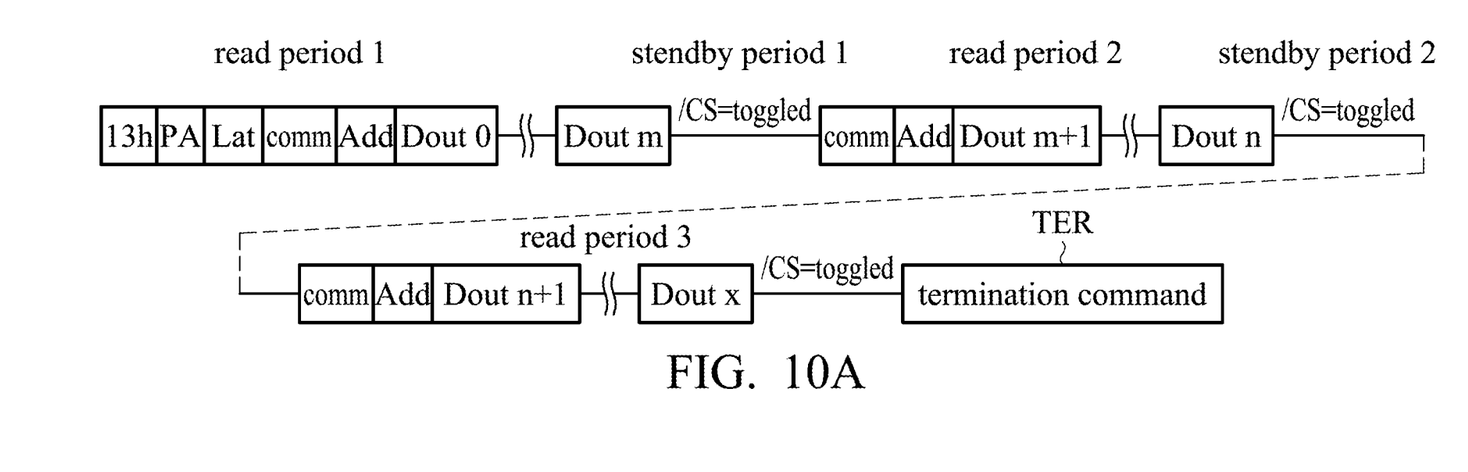
FIG. 10A is a schematic view showing a continuous reading operation of a flash memory according to the first embodiment.

FIG. 10A shows a timing chart of a continuous reading operation of the embodiment. First, as described above, in the readout period 1, the host device 20 outputs a page-data read command "13h", a page address, a command (comm) for continuous reading, and an address to the flash memory 100. The flash memory 100 outputs the data from the starting column address of the page designated by the page address PA (here, serially from the data Dout0).

The host device 20 receives the data (Dout 0 to Dout m) serially output from the flash memory 100 through the cache register. When the free space of the cache register decreases, the chip selection signal CS is set to a high (H) level (standby period 1) during the period in which the CPU processes the data in the cache register When the chip selection signal CS reaches the high (H) level, the flash memory 100 enters a non-selected state and the continuous reading stops temporarily, but the continuous reading mode is continued (step S140). In cases where the flash memory 100 is not in the continuous reading mode, as shown in FIG. 1B, when the chip selection signal CS reaches the high (H) level, the data held in the page buffer/sensing circuit 170 becomes unstable, or the data held in the page buffer/sensing circuit 170 is reset. That is, when the chip selection signal CS reaches the high level, since it is unknown that the data outputting is completed for which column of which page, the data held in the page buffer/sensing circuit 170 serves as unstable or rest data for processing. Then, the chip selection signal CS reaches the low level, the page-data read command "13h" and the page address PA are required again.

On the other hand, in the continuous reading mode, the control portion 150 stores the page address and column address which are last read when the chip selection signal CS is at the high level. Moreover, in the standby period 1, the data of the buffer/sensing circuit 170 and the data of the data register 130 are held without being reset. For example, the page address may be held in the address counter of the word line selection circuit 160, and the column address may be held in the address counter of the column selection circuit 180. Next, when the chip selection signal CS is switched to the low level and a command for continuous reading is input from the host device 20, the control unit 150 starts reading data from the next column address of the page which was presented when the continuous reading was temporarily suspended according to the stored page address and column address. Therefore, in the continuous reading mode, when the chip selection signal CS is toggled to the low level, the host device 20 does not need to output the page-data read command "13h" and the page address PA to the flash memory 100.

As shown in FIG. 10A, in the reading period 2, the flash memory 100 starts serially outputting data from the data Dout m+1 of the next column address. Thus, during the duration of the continuous reading mode, the host device 20 merely inputs the command and the dummy address for the continuous reading to the flash memory 100 each time the chip selection signal CS is toggled, so that the host device 20 can receive the data which is continuously read from the flash memory 100. Therefore, the host device 20 can promptly input a command and a dummy address for continuous reading without waiting for the latency Lat corresponding to a period in which the data is read from the page of the flash memory 100.

Thereafter, similarly, the host device 20 can continue the continuous reading mode until receiving the desired data. In order to terminate the continuous reading operation, the host device 20 toggles the chip selection signal CS and then issues a command related the termination of the continuous reading to the flash memory 100 (S150). When a command related to the termination of the continuous reading is input, the control portion 150 terminates the continuous reading in response to the command (S170). The command related to the termination of the continuous reading is input to the flash memory 100 in accordance with the serial input sequence shown in FIG. 9, and in this case, since the address is practically unnecessary, the dummy address is serially input. FIG. 10A shows an example in which a command TER related to the termination of the continuous reading is output to the flash memory 100 after the host device 20 receives the desired series of data Dout 0 to Dout x and after the chip selection signal CS is set to the low level to select the flash memory 100.

Here, the command related to the termination of the continuous reading is not limited to a dedicated command only for terminating the continuous reading. That is, in addition to a dedicated command, an existing command can be combined with the command related to the termination of the continuous reading. In cases where existing commands are used in combination, a command other than a read command, such as a command related to programming or erasing, can be used for the command related to the termination of the continuous reading. When a command related to the programming or erasing is executed, since all the data held in the page buffer/sensing circuit 170 and the data register 130 is reset, this action is practically equal to the action which is performed when the chip selection signal is switched to the high level in a discontinuous reading mode. Therefore, it is possible to use a command related to the programming or erasing for a command related to the termination of continuous reading.

The control portion 150 continues to be in the continuous reading mode (S180) until a command related to the termination of the continuous reading is input. However, in cases where the command related to the termination of the continuous reading has not yet been input during the period in which the continuous reading is performed until the last column of the address of the page which is read continuously is reached (S150, S160), when the last column of the address of the device is reached, the continuous reading terminates (S170).

By making the flash memory 100 to correspond to a command related to the termination of the continuous reading, it is possible to continue the continuous reading mode until a command related to the termination of the continuous reading is input. During the continuous reading mode, even when the chip selection signal CS is toggled, the host device 20 can perform the continuous reading without inputting the page-data read command "13h" and the page address PA. Compared with prior arts, it is possible to shorten the time for the continuous reading and to reduce the loading on the host device 20 while giving the processing time of the CPU to the host device 20. Furthermore, by eliminating the page-data read command "13h" and the page address PA specific to the NAND flash memory, the host device 20 can perform the continuous reading with commands and addresses similar to those of a NOR serial flash memory, which improves compatibility with a NOR flash memory.

Next, a second embodiment of the present invention will be described. The flash memory 100 has a function of automatically reading data of a predetermined page of the memory cell array 110 from the page buffer/sensing circuit 170 when the power supply is turned on, which serves as a power up sequence. For example, in the power-up sequence, the configuration register is accessed first and then starts operating in accordance with the configuration information stored therein. In the configuration information, a page address to be read first from the memory cell array is set when the power supply is turned on. According to the second embodiment, in the power-up sequence, the control portion 150 uses the page address to be read first from the memory cell array (hereinafter referred to as the initial page address for convenience) as the page address PA.

Figure 11:
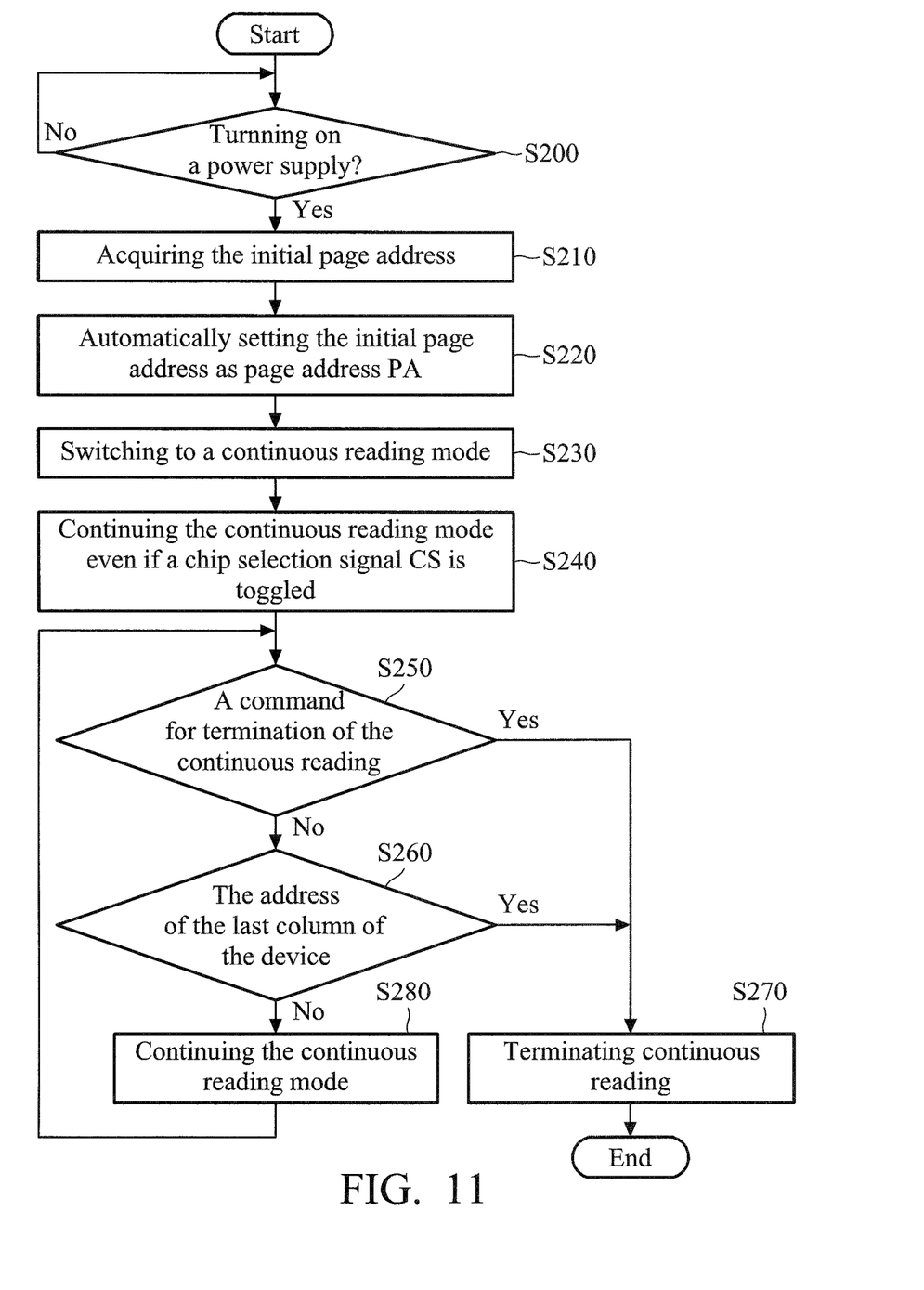
FIG. 11 shows a flow chart of a continuous reading operation of a flash memory according to the second embodiment.

FIG. 11 shows a flow chart of a continuous reading operation according to the second embodiment. The control portion 150 monitors the turned-on state of the power supply (S200) and acquires the initial page address in the power up sequence when the power supply is turned on (S210). Next, the control portion 150 automatically sets the initial page address as the page address PA (S220). When a command and an address for the continuous reading are input from the host device 20, the control portion 150 starts the continuous reading and is switched to the continuous reading mode (S230). As a result, even if the chip selection signal CS is toggled, the host device 20 does not input the page-data read command "13h" and the page address PA to the flash memory 100, but can start the continuous reading in the flash memory 100 through inputting a command (such as "13h") and a dummy address for the continuous reading (S240).

The operations in the subsequent steps S250 to S270 are the same as the operations in the steps S150 to S170 shown in FIG. 8. When a command related to the termination of the continuous reading is input from the host device 20, the control portion 150 terminates the continuous reading (S270). If no command related to the termination of the continuous reading is input, when the last column address of the last page is reached, the continuous reading is terminated (S270). In cases where the command related to the termination of the continuous reading has not yet been input, the continuous reading is performed continuously (S280) until the last column of the address of the page is reached.

Figure 10B:
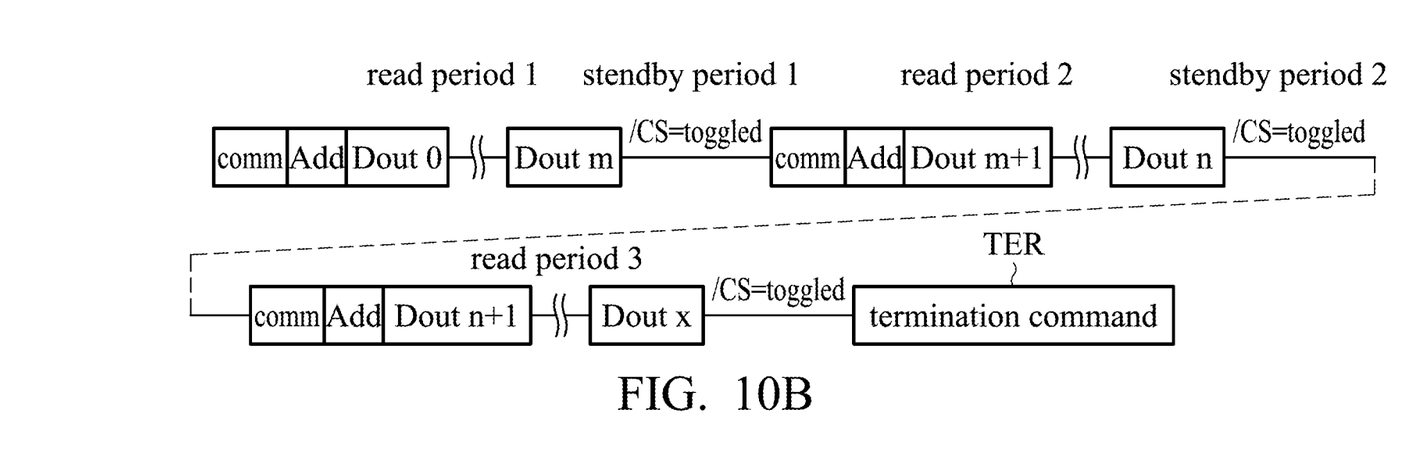
FIG. 10B is a schematic view showing a continuous reading operation of a flash memory according to a second embodiment.

FIG. 10B shows a timing chart of a continuous reading according to the second embodiment. It should be noted here that in the first readout period 1, unlike in the first embodiment, inputting the page-data read command "13h" and the page address PA is not required.

A continuous reading mode of a NAND flash memory equipped with a conventional serial interface terminates when the chip selection signal CS is disabled to a high level. On the other hand, after the NAND flash memory equipped with the serial interface of the present embodiment switches to the continuous reading mode, the continuous reading mode is continued until a command related to the termination of the continuous reading is input. Even if the chip selection signal CS is toggled, since the page-data read command "13h" and the page address PA are not input, the continuous reading which was temporarily suspended can start again promptly. As a result, it is possible to shorten the time required for the continuous reading and to further improve the compatibility with the NOR type serial flash while reducing the burden on the host device.

It should be noted that the present invention can be applied to any of a flash memory in which memory cells store binary data or a flash memory in which memory cell store multi-level data. Further, the present invention can be applied to a two-dimensional (2D) flash memory in which NAND strings of a memory array are formed on a substrate surface, or a three-dimensional (3D) flash in which NAND strings are formed in a conductive layer (for example, a polysilicon layer) of a substrate surface.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A semiconductor memory device comprising:
a memory cell array;
a page-reading portion selecting a page of the memory cell array, reading data of the selected page, and transmitting the read data to a data-holding portion; and
a control portion controlling continuous reading of pages in response to a host read command received from a host, wherein the continuous reading of pages is performed by the page-reading portion,
wherein the host read command comprises a first portion and a second portion, the first portion comprises a page-data read command and a page address, and the second portion comprises a command and a dummy address for the continuous reading of pages,
wherein in a first read period with a chip selection signal being in a low logic state, a continuous reading mode for the continuous reading of pages is triggered in response to the host read command,
wherein in a standby period following the first read period, the continuous reading of pages stops in response to the chip selection signal being a high logic state,
wherein in a second read period following the standby period, the continuous reading of pages is resumed to read the next data using the second portion of the host read command without the first portion of the host read command and a column address in response to the chip selection being toggled to the low logic state, and
wherein the continuous reading mode is continued until a command related to termination of the continuous reading of pages has been received by the control portion.

2. The semiconductor memory device according to claim 1, wherein the command related to the termination of the continuous reading of pages is a command for programming, a command for erasing, or a predetermined command.

3. The semiconductor memory device according to claim 1, wherein during the continuous reading mode, the control portion stores the page address and the column address which are presented when the chip selection signal is disabled, the read data is held by the page-reading portion, and
wherein when the chip selection signal is toggled, the control portion outputs the data which is held by the page-reading portion according to the stored page address and column address.

4. The semiconductor memory device according to claim 1, wherein a page which is initially selected by the page-reading portion during the continuous reading mode is designated by the page address which is input to the semiconductor memory device.

5. The semiconductor memory device according to claim 1, further comprising:
an output portion, in response an external serial clock, serially outputting the data which is read continuously,
wherein the output portion comprises a holding portion which holds data transmitted from the data-holding portion, and
wherein during a period in which the data is transmitted from the data-holding portion, the data of the selected page of the memory cell array is held in the data-holding portion.

6. The semiconductor memory device according to claim 1, wherein the semiconductor memory device is a NAND flash memory.

7. A flash memory comprising:
a NAND memory cell array;
a page buffer holding data transmitted from a selected page of the NAND memory cell array or holding programming data;
a data register performing a bidirectional data transmission with the page buffer; and
a continuous reading portion continuously reading data of pages of the NAND memory cell array in response to a host read command received from a host and outputting the data in synchronization with an external serial clock through the data register,
wherein the host read command comprises a first portion and a second portion, the first portion comprises a page-data read command and a page address, and the second portion comprises a command and a dummy address for continuous reading of pages,
wherein in a first read period with a chip selection signal being in a low logic state, a continuous reading mode for the continuous reading of pages is triggered in response to the host read command,
wherein in a standby period following the first read period, the continuous reading of pages stops in response to the chip selection signal being toggled to a high logic state,
wherein in a second read period following the standby period, the continuous reading of pages is resumed to read the next data using the second portion of the host read command without the first portion of the host read command and a column address in response to the chip selection being toggled to the low logic state, and
wherein the continuous reading mode is continued until a command related to termination of the continuous reading of pages has been input.

8. A continuous reading method comprising:
receiving a host read command from a host, wherein the host read command comprises a first portion and a second portion, the first portion comprises a page-data read command and a page address, and the second portion comprises a command and a dummy address for continuous reading of pages;
in a first read period with a chip selection signal being in a low logic state, trigging a continuous reading mode for the continuous reading of pages in response to the host read command;
in a standby period following the first read period, stopping the continuous reading of pages in response to the chip selection signal being toggled to a high logic state, and;

in a second read period following the standby period, resuming the continuous reading of pages to read the next data using the second portion of the host read command without the first portion of the host read command and a column address in response to the chip selection being toggled to the low logic state; and monitoring whether a command for termination of continuous reading of pages is input during the continuous reading mode;

when the command for the termination of the continuous reading of pages is input, terminating the continuous reading mode; and when the command for the termination of the continuous reading of pages is not input, performing the continuous reading continuously in a continuous reading mode, wherein, the continuous reading mode is continued until the command for termination of the continuous reading pages has been input.

9. The continuous reading method according to claim 8, further comprising:

serially outputting page data in synchronization with an external serial clock.

\* \* \* \* \*